(12) United States Patent  (10) Patent No.: US 8,878,578 B2
Tamura  (45) Date of Patent: Nov. 4, 2014

(54) JITTER MONITOR

(71) Applicant: Fujitsu Limited, Kawasaki (JP)

(72) Inventor: Hirotaka Tamura, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/068,661

(22) Filed: Oct. 31, 2013

(65) Prior Publication Data

US 2014/0203852 A1  Jul. 24, 2014

(30) Foreign Application Priority Data

Jan. 22, 2013  (JP) ................................. 2013-009518

(51) Int. Cl.
*H03L 7/06* (2006.01)
*H03K 3/012* (2006.01)
*H03K 3/013* (2006.01)

(52) U.S. Cl.
CPC .............. *H03K 3/012* (2013.01); *H03K 3/013* (2013.01)
USPC ...................................................... 327/155

(58) Field of Classification Search
None
See application file for complete search history.

(56) References Cited

U.S. PATENT DOCUMENTS

| 5,557,648 | A * | 9/1996 | Ishihara .......................... 375/376 |
| 6,480,047 | B2 * | 11/2002 | Abdel-Maguid et al. ..... 327/161 |
| 6,765,975 | B2 * | 7/2004 | Dunning et al. ............... 375/371 |
| 7,460,451 | B2 * | 12/2008 | Baba .......................... 369/47.28 |
| 2011/0228887 | A1 * | 9/2011 | Kim et al. ..................... 375/359 |
| 2014/0073243 | A1 * | 3/2014 | Hijioka et al. ................ 455/41.1 |
| 2014/0203852 | A1 * | 7/2014 | Tamura ......................... 327/155 |

FOREIGN PATENT DOCUMENTS

| JP | 5-4373 Y2 | 2/1993 |
| JP | 6-83193 B2 | 10/1994 |

* cited by examiner

*Primary Examiner* — Lincoln Donovan
*Assistant Examiner* — Khareem E Almo
(74) *Attorney, Agent, or Firm* — Arent Fox LLP

(57) ABSTRACT

A jitter monitor includes: a voltage generating circuit configured to generate a first voltage that is varied with time at a predetermined inclination; a voltage reducing circuit configured to reduce the first voltage by a predetermined voltage in synchronization with a first clock signal so as to generate a second voltage that is varied with time at the predetermined inclination in synchronization with the first clock signal; and a sampling circuit configured to sample a portion having the predetermined inclination of the second voltage.

13 Claims, 7 Drawing Sheets

JITTER MONITOR

CROSS-REFERENCE TO RELATED APPLICATION

This application is based upon and claims the benefit of priority of the prior Japanese Patent Application No. 2013-009518, filed on Jan. 22, 2013, the entire contents of which are incorporated herein by reference.

FIELD

The embodiments discussed herein are related to a jitter monitor.

BACKGROUND

Components in computers and other information processing devices have been greatly improved in performance. For example, the improvement in performance is achieved in memories, processors, and switch large scale integration (LSI) circuits. In order to improve the performance of systems, it is desirable to increase the signal transmission speed between the components or elements, in addition to the improvement of the components in performance. For example, it is desirable to increase the signal transmission rate between memories, such as static random access memories (SRAMs) or dynamic random access memories (DRAMs), and processors in order to improve the performance of the computers. In addition, along with the improvement of the performance of the information processing devices, such as apparatuses for communication infrastructure, it is desirable to increase the data rate in signal transmission and reception inside and outside the apparatuses. In order to meet the demand for the increase in data rate, the data rates of input-output circuits in many integrated circuits are desirably increased from several gigabits per second to several tens of gigabits per second. For example, as of 2012, it is considered that the data rates of about 10 gigabits per second to 30 gigabits per second are desirably achieved in the current high-end servers and the data rates of about 30 gigabits per second to 60 gigabits per second are desirably achieved in next generation machines. The frequency corresponding to a data rate D [bits/s] is called a baud rate fb (=D) and its reciprocal is called a data period T (=1/fb) or one unit interval (1 UI).

It is desirable to achieve high timing accuracy in circuits composing transmission and reception circuits of signals at such high data rates. This is because 1 UI has a very low value of 10 picoseconds (ps) to 20 ps. It is desirable to set the values of timing jitter of clock signals to be supplied to element circuits to values sufficiently lower than the value of 1 UI. In order to reduce the jitter, it is desirable to increase the sizes of transistors and to increase the power consumption.

In order to reduce the jitter while suppressing the power consumption, design approaches to allocate (budgeting) an appropriate amount of jitter to each element circuit are in widespread use. In such a case, certain jitter budget is allocated to each element circuit to design the circuit so that the amount of jitter that occurs is within the value of the jitter budget. It is desirable to evaluate how much jitter each element circuit in the circuits that have been actually designed generates in order to appropriately perform the design based on the jitter budget.

In addition, loop control circuits are known (for example, refer to Japanese Examined Patent Application Publication No. 6-83193). The loop control circuits each include a saw-tooth-wave generating unit that generates a saw tooth wave that is controlled in response to an input signal and that has a period coinciding with the period of the input signal. In a typical loop control circuit, a sample-hold unit samples and holds the saw tooth wave at a peak position to acquire the maximum voltage of the saw tooth wave. A subtracting unit calculates a differential voltage between the maximum voltage and a reference voltage. An integration unit integrates the differential voltage. A control unit controls the inclination of the saw tooth wave on the basis of the output from the integration unit so that the maximum voltage of the saw tooth wave agrees with the reference voltage. The integration unit performs the integration with a certain time shorter than the sampling period in synchronization with the sampling.

Furthermore, gate pulse generation circuits are also known (for example, refer to Japanese Examined Utility Model Registration Application Publication No. 5-4373). A typical gate pulse generation circuit generates a gate pulse to trigger off the gate for extracting a horizontal synchronization signal from a complex video signal that is read out in a time-axis correction circuit in a recording medium playing apparatus. The gate pulse generation circuit generates a slope signal having a certain period. A sample-hold unit samples and holds the slope signal at timing corresponding to the horizontal synchronization signal included in the complex video signal that is read out. The gate pulse generation circuit shifts the output from the sample-hold unit in level by a certain value to generate first and second shift voltages and generates the gate pulse only while the level of the slope signal is within the range of the first and second shift voltages.

SUMMARY

According to an aspect of the invention, a jitter monitor includes: a voltage generating circuit configured to generate a first voltage that is varied with time at a predetermined inclination; a voltage reducing circuit configured to reduce the first voltage by a predetermined voltage in synchronization with a first clock signal so as to generate a second voltage that is varied with time at the predetermined inclination in synchronization with the first clock signal; and a sampling circuit configured to sample a portion having the predetermined inclination of the second voltage.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Jitter monitors for measuring the amount of jitter of clock signals are used for the design based on the jitter budget. The jitter monitors have larger amounts of circuits and low-jitter clock signals are externally supplied to the jitter monitors. Jitter monitors which have smaller amounts of circuits and to which the low-jitter clock signals are not externally supplied will herein be described with reference to the attached drawings.

First Embodiment

Figure 1A:
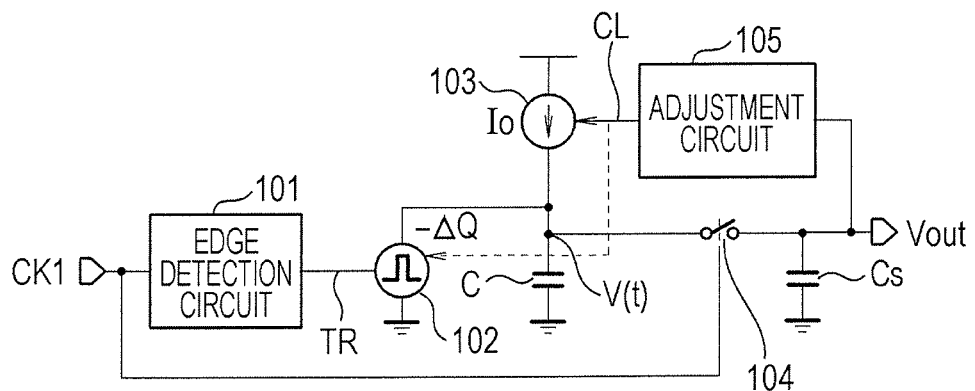
FIG. 1A illustrates an exemplary configuration of a jitter monitor according to a first embodiment.
Figure 1B:
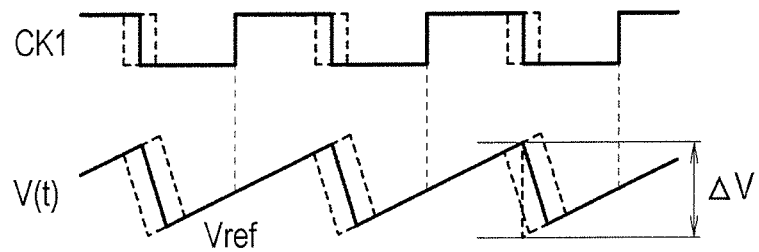
FIG. 1B is a timing chart illustrating an exemplary operation of the jitter monitor.

FIG. 1A illustrates an exemplary configuration of a jitter monitor according to a first embodiment. FIG. 1B is a timing chart illustrating an exemplary operation of the jitter monitor. Referring to FIG. 1A, a capacitor C is connected between a node V(t) and a ground voltage node. A first current source 103 is connected between a supply voltage node and the node V(t) and supplies constant current Io to the capacitor C. The first current source 103 and the capacitor C composes a voltage generating circuit that generates and outputs the voltage at the node V(t), which is varied with time at a certain inclination.

An edge detection circuit 101 outputs a high-level pulse edge detection signal TR upon detection of a falling edge of a first clock signal CK1. A voltage reducing circuit 102 is connected between the node V(t) and the ground voltage node and discharges a certain amount of charge ΔQ from the node V(t) upon reception of the high-level pulse edge detection signal TR. Accordingly, the voltage reducing circuit 102 is capable of decreasing the voltage at the node V(t) by certain voltage ΔV in synchronization with the falling edge of the first clock signal CK1. A sampling circuit 104 is, for example, a sampling switch. The sampling circuit 104 is used to connect the node V(t) to an output terminal Vout in synchronization with a rising edge of the first clock signal CK1. A capacitor Cs is connected between the output terminal Vout and the ground voltage node. A relationship C>>Cs is established between the capacitor C and the capacitor Cs. Accordingly, the sampling circuit 104 samples a portion having a certain inclination of the voltage at the node V(t) in synchronization with the rising edge of the first clock signal CK1 to supply the sampled voltage to the output terminal Vout.

The node V(t) has a certain average value Vref on each cycle if the constant current Io supplied from the first current source 103 has an appropriate value. However, the average value at the node V(t) on one cycle is increased for every cycle if the constant current Io is too large and the average value at the node V(t) on one cycle is decreased for every cycle if the constant current Io is too small.

Similarly, the node V(t) has a certain average value Vref on each cycle if the voltage ΔV by which the voltage at the node V(t) is decreased by the voltage reducing circuit 102 has an appropriate value. However, the average value at the node V(t) on one cycle is decreased for every cycle if the voltage ΔV is too high and the average value at the node V(t) on one cycle is increased for every cycle if the voltage ΔV is too low.

The constant current Io and the voltage ΔV described above are varied with the variation in temperature and process. An adjustment circuit 105 adjusts the inclination of the voltage at the node V(t) or the certain voltage value ΔV by which the voltage at the node V(t) is decreased by the voltage reducing circuit 102 with a control signal CL on the basis of the voltage at the output terminal Vout so that the time average value of the voltage at the node V(t) for every cycle is equal to the certain reference value Vref.

As described above, the jitter monitor generates a voltage slope waveform that does not depend on the jitter of the first clock signal CK1 and samples the voltage slope waveform in synchronization with the first clock signal CK1 to obtain a voltage signal in which the amount of jitter of the first clock signal CK1 is reflected in order to measure the amount of jitter of the first clock signal CK1.

The first current source 103 causes the constant current Io to flow through the capacitor C to generate a voltage waveform that is increased at a certain inclination. The voltage reducing circuit 102 withdraws the amount of charge ΔQ from the capacitance of the capacitor C in synchronization with the falling edge of the first clock signal CK1 to decrease the voltage at the node V(t) by the certain voltage ΔV=ΔQ/C. This generates a voltage waveform of a saw tooth wave at the node V(t). In order to keep the average level of the voltage of the saw tooth wave at the certain reference value Vref, the current Io supplied from the first current source 103 is desirably equal to the average current that flows out by the withdrawal of the electric charge by the voltage reducing circuit 102. This means that f×ΔQ=Io is established where f denotes the frequency of the first clock signal CK1. The adjustment circuit 105 adjusts the current Io or the amount of charge ΔQ so that the average level of the voltage at the node V(t) is kept at the certain reference value Vref.

The inclined portion of a central part of the voltage waveform at the node V(t) occurring at the capacitor C is not varied even if the timing of the falling edge of the first clock signal CK1 is laterally shifted due to the jitter. Accordingly, the waveform at the inclined portion of the central part of the voltage at the node V(t) may be used as a reference voltage (a reference waveform) for measuring the amount of jitter of the first clock signal CK1. The sampling of the inclined portion of the voltage waveform at the node V(t) at the timing of the rising edge of the first clock signal CK1 by the sampling circuit 104 makes the voltage value that is sampled a voltage signal representing the amount of jitter. In other words, the voltage at the output terminal Vout is proportional to the amount of jitter. If the voltage at the output terminal Vout is equal to the reference value Vref, the amount of jitter is equal to zero. The amount of jitter is increased with the increasing difference between the voltage at the output terminal Vout and the reference value Vref.

Figure 2:
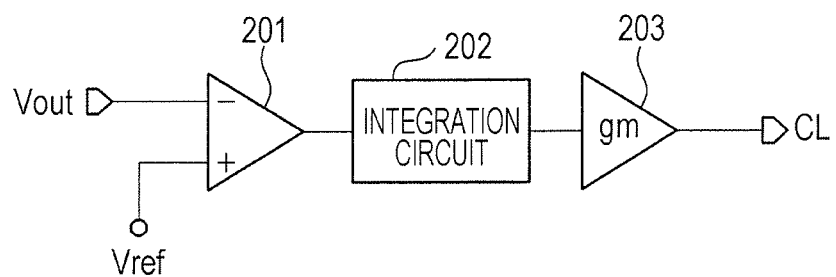
FIG. 2 illustrates an exemplary configuration of an adjustment circuit in FIG. 1A.

FIG. 2 illustrates an exemplary configuration of the adjustment circuit 105 illustrated in FIG. 1A. Referring to FIG. 2, a differential amplifier circuit 201 amplifies the difference between the voltage at the output terminal Vout and the reference value Vref to output the result of the amplification. An integration circuit 202 integrates the output voltage of the differential amplifier circuit 201 to output the voltage subjected to the integration. A trans-conductance (gm) amplifier 203 outputs current proportional to the output voltage of the integration circuit 202 as the control signal CL. The current Io of the first current source 103 in FIG. 1A is controlled so as to be proportional to the output voltage of the integration circuit 202 in the above manner. If the voltage at the output terminal Vout is different from the reference value Vref, the value of the current Io is increased or decreased until the difference is made zero. The voltage at the output terminal Vout is finally balanced with the reference value Vref. The adjustment circuit 105 adjusts the inclination of the voltage at the node V(t) or the certain voltage value ΔV by which the voltage at the node V(t) is decreased by the voltage reducing circuit 102 so that the time average value of the voltage at the node V(t) is equal to the reference value Vref. The differential amplifier circuit 201 may amplify the difference between the voltage at the node V(t) in FIG. 1A and the reference value Vref to output the result of the amplification. Also in this case, a similar operation is performed.

Figure 3A:
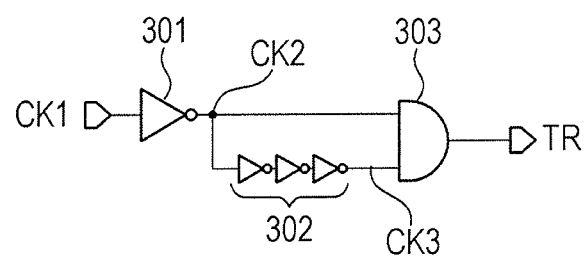
FIG. 3A illustrates an exemplary configuration of en edge detection circuit in FIG. 1A.
Figure 3B:
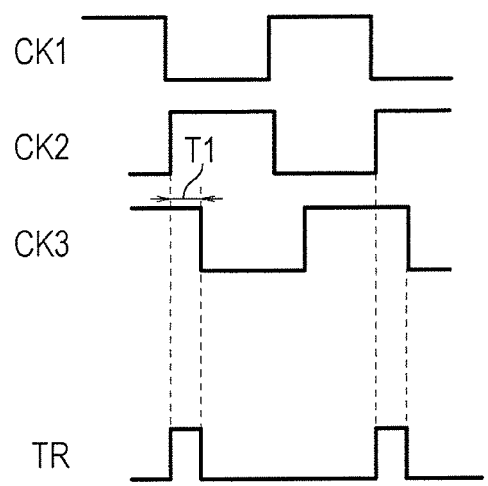
FIG. 3B is a timing chart for describing the operation of the edge detection circuit.

FIG. 3A illustrates an exemplary configuration of the edge detection circuit 101 in FIG. 1A. FIG. 3B is a timing chart for describing the operation of the edge detection circuit 101. Referring to FIG. 3A, an inverter 301 outputs a logically inverted signal CK2 of the first clock signal CK1. Inverters 302 of an odd number output a signal CK3 resulting from logical inversion of the signal CK2 and delay of the signal CK2 subjected to the logical inversion by a delay time T1. A logical AND circuit 303 outputs the logical AND signal of the signal CK2 and the signal CK3 as the edge detection signal TR. As described above, upon detection of the falling edge of the first clock signal CK1, the edge detection circuit 101 outputs the high-level pulse edge detection signal TR.

As described above, the relationship between the frequency f of the first clock signal CK1, the amount of charge ΔQ, and the current Io is represented by f×ΔQ=Io and the inclination of the voltage waveform at the node V(t) is represented by dV/dt=Io/C. At the node V(t), the change in voltage per 1 UI (=1/f) is represented by (Io/C)×(1/f)=ΔV. Provided that the voltage ΔV has a value of 300 mV and the frequency f of the first clock signal CK1 is 20 GHz, a jitter measurement sensitivity of 6 mV/ps is achieved.

According to the first embodiment, it is possible to measure the amount of jitter of the first clock signal CK1 with the relatively simple circuit in which the capacitor C, the first current source 103, and compact logical gates are combined with each other without the external supply of a low-jitter reference clock signal. With the jitter monitor of the first embodiment, it is possible to actually measure the amount of jitter of the clock signal in various portions in the circuit.

Although the example is described above in which the voltage reducing circuit 102 reduces the voltage in synchronization with the falling edge of the first clock signal CK1 and the sampling circuit 104 performs the sampling in synchronization with the rising edge of the first clock signal CK1, the above example is not limitedly used. The voltage reducing circuit 102 may reduce the voltage in synchronization with the rising edge of the first clock signal CK1 and the sampling circuit 104 may perform the sampling in synchronization with the falling edge of the first clock signal CK1.

Second Embodiment

Figure 4:
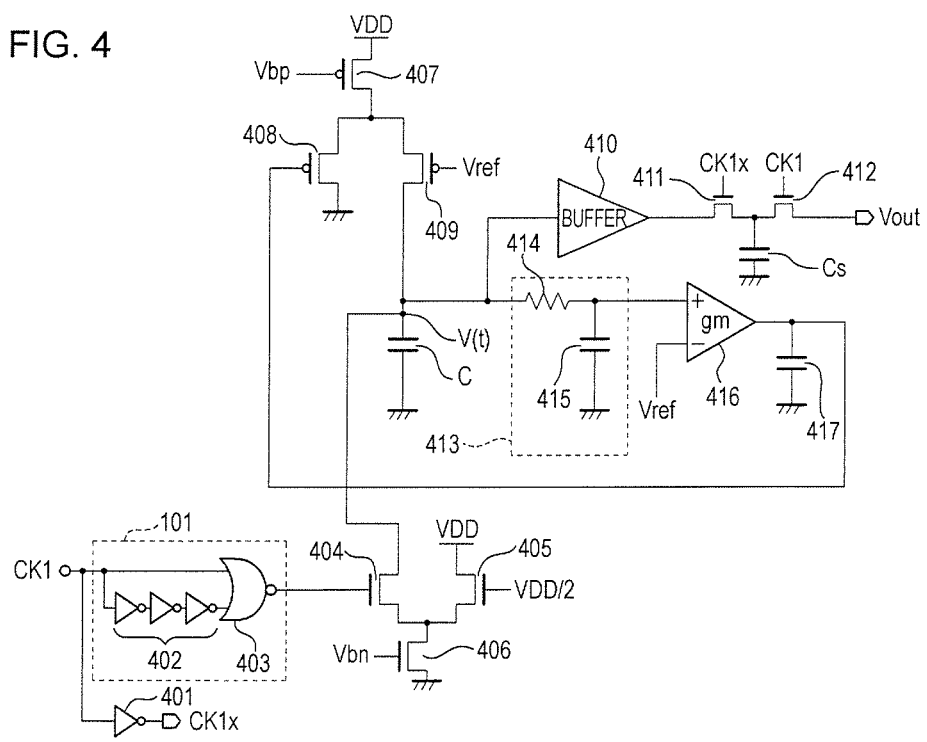
FIG. 4 illustrates an exemplary configuration of a jitter monitor according to a second embodiment.

FIG. 4 illustrates an exemplary configuration of a jitter monitor according to a second embodiment. A specific exemplary configuration of the jitter monitor in FIG. 1A is illustrated in FIG. 4. Referring to FIG. 4, an inverter 401 outputs a clock signal CK1x resulting from the logical inversion of the first clock signal CK1. The edge detection circuit 101 includes inverters 402 of an odd number and a negative OR circuit 403 and outputs the high-level pulse edge detection signal upon detection of the falling edge of the first clock signal CK1. The capacitor C is connected between the node V(t) and the ground voltage node.

Transistors 407 to 409 correspond to the first current source 103 in FIG. 1A. The source of the p-channel field effect transistor 407 is connected to the node of a supply voltage VDD and the gate thereof is connected to a bias voltage node Vbp. The source of the p-channel field effect transistor 408 is connected to the drain of the transistor 407, the gate thereof is connected to an output terminal of a differential input trans-conductance (gm) amplifier 416, and the drain thereof is connected to the ground voltage node. The source of the p-channel field effect transistor 409 is connected to the drain of the transistor 407, the gate thereof is connected to the node of the reference voltage Vref, and the drain thereof is connected to the node V(t). The voltage at the node V(t) is varied with time at a certain inclination.

Transistors 404 to 406 correspond to the voltage reducing circuit 102 in FIG. 1A. The n-channel field effect transistor 406 is a second current source. The source of the n-channel field effect transistor 406 is connected to the ground voltage node and the gate thereof is connected to a bias voltage node Vbn. The supply of a bias voltage from the outside of a semiconductor chip of the jitter monitor to the bias voltage node Vbn allows the jitter measurement less affected by the variation in the power voltage in the semiconductor chip of the jitter monitor to be advantageously realized. The source of the n-channel field effect transistor 404 is connected to the drain of the transistor 406, the gate thereof is connected to the output terminal of the edge detection circuit 101, and the drain thereof is connected to the node V(t). The source of the n-channel field effect transistor 405 is connected to the drain of the transistor 406, the gate thereof is connected to the node of a voltage VDD/2, and the drain thereof is connected to the node of the supply voltage VDD.

In response to the falling of the first clock signal CK1, the edge detection circuit 101 outputs the high-level pulse edge detection signal. Upon reception of the high-level pulse edge detection signal by the n-channel field effect transistor 404, the terminal node V(t) of the capacitor C is connected to the ground voltage node via the n-channel field effect transistor 404. As a result, the electric charge of the node V(t) is discharged to the ground voltage node by the amount of charge ΔQ and the voltage at the node V(t) is reduced by the voltage ΔV.

A low pass filter 413, the differential input trans-conductance amplifier 416, and the capacitor C correspond to the adjustment circuit 105 in FIG. 1A. The low pass filter 413 includes a resistor 414 and a capacitor 415 and performs low pass filtering to the voltage at the node V(t) to output a low frequency component. The differential input trans-conductance amplifier 416 outputs current (amplified current) proportional to the differential voltage between the output voltage of the low pass filter 413 and the reference voltage Vref. A capacitor 417 is connected between the output terminal of the differential input trans-conductance amplifier 416 and the ground voltage node and performs the integration. The voltage of the capacitor 417 corresponds to the control signal CL in FIG. 1A and is supplied to the gate of the transistor 408. As a result, the current Io of the first current source 103 is adjusted.

A buffer 410 buffers the voltage at the node V(t) to output the buffered voltage. Transistors 411 and 412 correspond to the sampling circuit 104 in FIG. 1A. The drain of the n-channel field effect transistor 411 is connected to the output terminal of the buffer 410 and the gate thereof is connected to the node of the clock signal CK1x. The capacitor Cs is connected between the source of the transistor 411 and the ground voltage node. The drain of the n-channel field effect transistor 412 is connected to the source of the transistor 411, the gate thereof is connected to the node of the first clock signal CK1, and the source thereof is connected to the output terminal Vout. In response to the falling of the first clock signal CK1, the transistor 411 is turned on and the transistor 412 is turned off. This starts the writing of the output voltage of the buffer 410 into the capacitor Cs. In response to the rising of the first clock signal CK1, the transistor 411 is turned off and the transistor 412 is turned on. This terminates the writing of the output voltage of the buffer 410 into the capacitor Cs and the voltage of the capacitor Cs is supplied to the output terminal Vout. This allows the sampling circuit 104 to sample the portion having a certain inclination of the voltage at the node V(t) in synchronization with the rising edge of the first clock signal CK1.

The average value of the saw-tooth-waveform voltage at the node V(t) is kept at the certain reference value Vref by the adjustment circuit 105. The withdrawal of the current of the node V(t) is performed in synchronization with the falling of the first clock signal CK1 and the sampling of the portion having a certain inclination of the saw tooth wave at the node V(t) is performed in synchronization with the rising edge of the first clock signal CK1. With the jitter monitor of the second embodiment, it is possible to measure the amount of jitter of the first clock signal CK1 without the external supply of the low-jitter reference clock signal.

Third Embodiment

Figure 5:
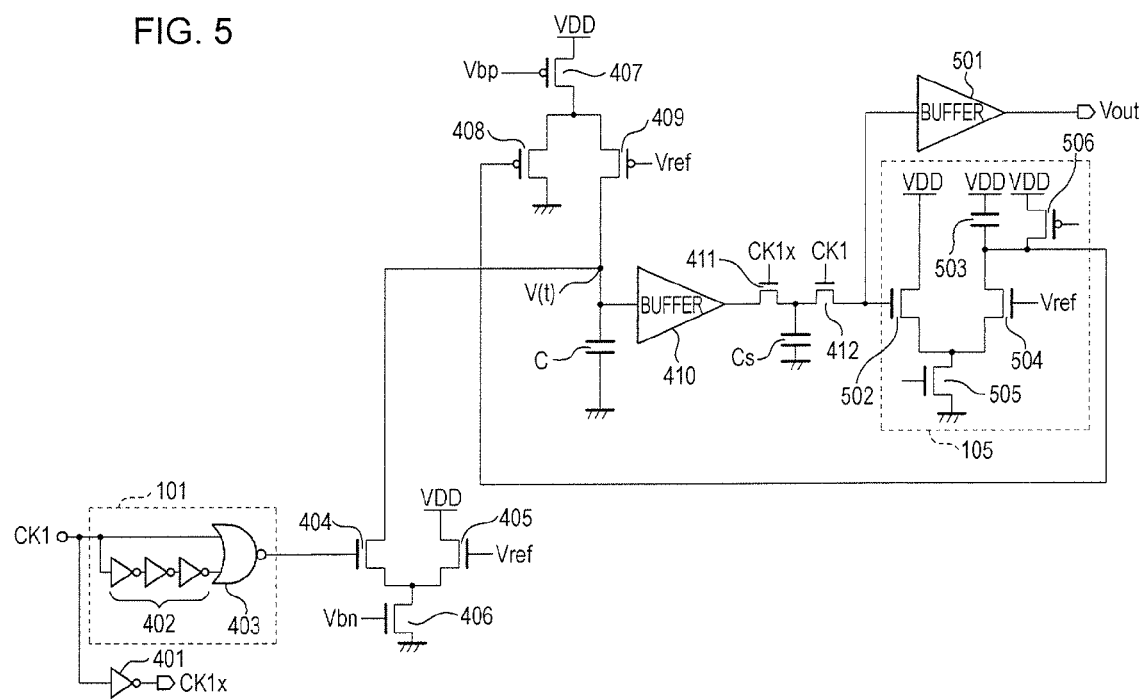
FIG. 5 illustrates an exemplary configuration of a jitter monitor according to a third embodiment.

FIG. 5 illustrates an exemplary configuration of a jitter monitor according to a third embodiment. A specific exemplary configuration of the jitter monitor in FIG. 1A is illustrated in FIG. 5. The third embodiment (FIG. 5) differs from the second embodiment (FIG. 4) in the following points. Instead of the voltage VDD/2, the reference voltage Vref may be applied to the gate of the transistor 405. A buffer 501 buffers the voltage of the source of the transistor 412 to output the buffered voltage to the output terminal Vout.

The adjustment circuit 105 includes a trans-conductance amplifier and supplies a voltage resulting from amplification and integration of the source voltage of the transistor 412 to the gate of the transistor 408. The drain of an n-channel field effect transistor 502 is connected to the node of the supply voltage VDD and the gate thereof is connected to the source of the transistor 412. The drain of an n-channel field effect transistor 505 is connected to the source of the transistor 502, the gate thereof is connected to the bias voltage node, and the source thereof is connected to the ground voltage node. A capacitor 503 is connected between the node of the supply voltage VDD and the drain of an n-channel field effect transistor 504. The gate of the n-channel field effect transistor 504 is connected to the node of the reference voltage Vref and the source thereof is connected to the drain of the transistor 505. The source of a p-channel field effect transistor 506 is connected to the node of the supply voltage VDD, the gate thereof is connected to the bias voltage node, and the drain thereof is connected to the drain of the transistor 504. The gate of the transistor 408 is connected to the drain of the transistor 504 and the voltage of the capacitor 503 is supplied to the gate of the transistor 408. The adjustment circuit 105 supplies a voltage resulting from the amplification and the integration of the difference between the output voltage of the sampling circuit 104 and the reference voltage Vref to the gate of the transistor 408. As a result, it is possible to adjust the current Io to be supplied to the node V(t).

The third embodiment differs from the second embodiment in that the adjustment circuit 105 amplifies and integrates the difference between the output voltage of the sampling circuit 104 and the reference voltage Vref, instead of (the low frequency component of) the saw tooth wave itself at the node V(t), to feed back the voltage resulting from the amplification and the integration. Since the adjustment circuit 105 performs the feedback operation so that the average level of the output voltage of the sampling circuit 104, instead of the saw tooth wave itself at the node V(t), agrees with the reference voltage Vref, an unnecessary high-frequency component is not input into the feedback circuit to advantageously enable the stable feedback operation.

Fourth Embodiment

Figure 6:
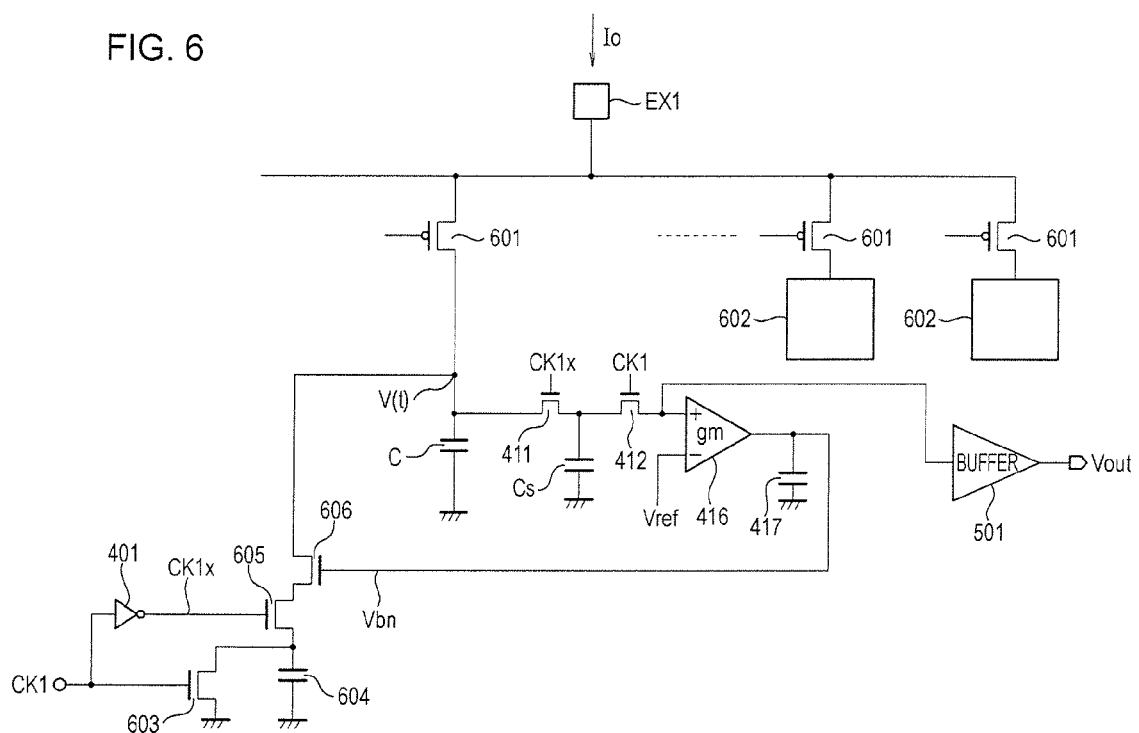
FIG. 6 illustrates an exemplary configuration of a jitter monitor according to a fourth embodiment.

FIG. 6 illustrates an exemplary configuration of a jitter monitor according to a fourth embodiment. A specific exemplary configuration of the jitter monitor in FIG. 1A is illustrated in FIG. 6. The fourth embodiment (FIG. 6) differs from the third embodiment (FIG. 5) in the following points.

An external terminal EX1 receives the constant current Io from the outside of the semiconductor chip of the jitter monitor. Multiple p-channel field effect transistors 601 serve as switches. The source of each of the transistors 601 is connected to the external terminal EX1, the gate thereof is connected to a switch control signal node, and the drain thereof is connected to the corresponding circuit block, among multiple circuit blocks 602. The circuit blocks 602 each include the same elements, excluding the external terminal EX1 and the transistors 601, in FIG. 6. Specifically, multiple pairs of the transistor 601 and the circuit block 602 are connected in parallel to the external terminal EX1. Turning on the transistor 601 corresponding to the circuit block 602 to which the measurement is to be performed allows the constant current Io to be supplied to the circuit block 602 to which the measurement is to be performed. The node V(t) is connected to the drain of each of the transistors 601. The capacitor C is connected between the node V(t) and the ground voltage node. Accordingly, the voltage at the node V(t) is varied with time at a certain inclination.

The inverter 401 outputs the clock signal CK1x resulting from the logical inversion of the first clock signal CK1. Transistors 603, 605, and 606 and a capacitor 604 correspond to the voltage reducing circuit 102 in FIG. 1A. The drain of the n-channel field effect transistor 606 is connected to the node V(t) and the gate thereof is connected to the bias voltage node Vbn. The drain of the n-channel field effect transistor 605 is connected to the source of the transistor 606 and the gate thereof is connected to the node of the clock signal CK1x. The drain of the n-channel field effect transistor 603 is connected to the source of the transistor 605, the gate thereof is connected to the node of the first clock signal CK1, and the source thereof is connected to the ground voltage node. The capacitor 604 is connected between the source of the transistor 605 and the ground voltage node.

In response to the rising of the first clock signal CK1 to a high level, the transistor 605 is turned off and the transistor 603 is turned on to connect both terminals of the capacitor 604 to the ground voltage node. As a result, the voltage of the capacitor 604 has a value of 0 V.

In response to the falling of the first clock signal CK1 to a low level, the transistor 605 is turned on and the transistor 603 is turned off. As a result, the capacitor 604 is connected to the node V(t), the electric charge of the node V(t) is withdrawn, and the capacitor 604 is charged with the withdrawn charge. Provided that the capacitance value of the capacitor 604 is denoted by C1 and a threshold voltage value of the transistor 606 is denoted by Vth, the voltage reducing circuit 102 withdraws the electric charge from the node V(t) by the amount of charge ΔQ=C1×(Vbn−Vth). As a result, the voltage at the node V(t) is reduced by the voltage ΔV.

The transistors 411 and 412 and the capacitor Cs correspond to the sampling circuit 104 in FIG. 1A and performs an operation similar to the one described above with reference to FIG. 5. The differential input trans-conductance (gm) amplifier 416 and the capacitor 417 correspond to the adjustment circuit 105 in FIG. 1A and performs an operation similar to the one described above with reference to FIG. 4. The differential input trans-conductance amplifier 416 outputs current (amplified current) proportional to the differential voltage between the output voltage of the sampling circuit 104 and the reference voltage Vref. The capacitor 417 is connected between the output terminal of the differential input trans-conductance amplifier 416 and the ground voltage node and performs the integration. The voltage of the capacitor 417 corresponds to the control signal CL in FIG. 1A and is supplied to the bias voltage node Vbn. The adjustment circuit 105 is capable of adjusting the voltage of the bias voltage node Vbn.

The gate of the transistor 606 is connected to the bias voltage node Vbn. The adjustment of the voltage of the bias voltage node Vbn adjusts the amount of charge ΔQ=C1×(Vbn−Vth) by which the electric charge is withdrawn from the node V(t) by the voltage reducing circuit 102 to control the voltage ΔV to be reduced. As a result, it is possible to keep the average value of the voltage at the node V(t) at the reference voltage Vref. The buffer 501 buffers the output voltage of the sampling circuit 104 to supply the buffered voltage to the output terminal Vout.

The adjustment circuit 105 supplies a voltage resulting from the integration of the difference between the output voltage of the sampling circuit 104 and the reference voltage Vref to the bias voltage node Vbn. The voltage at the bias voltage node Vbn is used to control the amount of withdrawn charge ΔQ. Since the transistor 606 flows the current until the source voltage reaches Vbn−Vth, the transistor 606 performs an operation to flow the total amount of charge ΔQ that is equal to C1×(Vbn−Vth). Since the external supply of the constant current Io causes the current Io that determines the inclination of the voltage at the node V(t) for the jitter measurement and the amount of withdrawn charge ΔQ for generating the saw tooth wave not to be affected by the variation in the power voltage inside the semiconductor chip, the jitter measurement less affected by the variation in the power voltage is advantageously is enabled.

Fifth Embodiment

Figure 7:
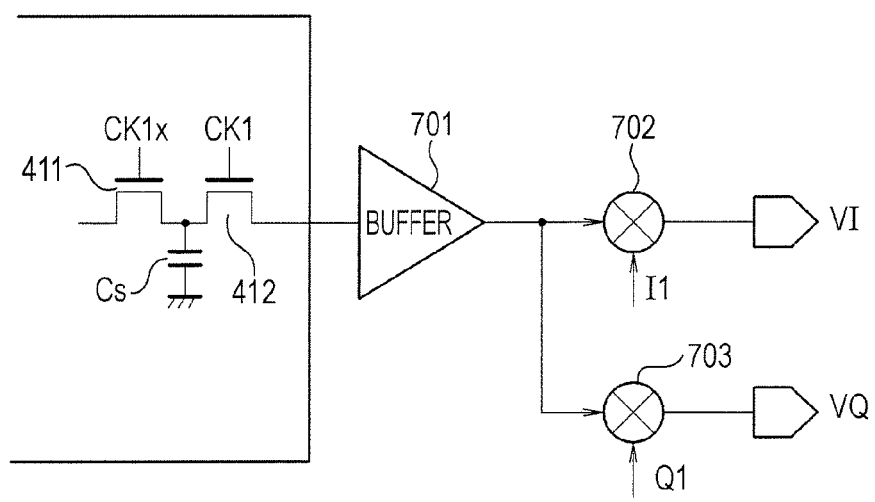
FIG. 7 illustrates an exemplary configuration of a jitter monitor according to a fifth embodiment.

FIG. 7 illustrates an exemplary configuration of a jitter monitor according to a fifth embodiment. Referring to FIG. 7, the transistors 411 and 412 and the capacitor Cs correspond to the sampling circuit 104 in FIG. 1A and correspond to the transistors 411 and 412 and the capacitor Cs in FIG. 4 to FIG. 6. The fifth embodiment differs from the second to fourth embodiments in the following points.

A buffer 701 buffers the output voltage of the sampling circuit 104 to output the buffered voltage. A first mixer 702 mixes a second clock signal I1 with the output voltage of the buffer 701 to output an I signal VI. A second mixer 703 mixes a third clock signal Q1 orthogonal to the second clock signal I1 with the output voltage of the buffer 701 to output a Q signal VQ.

As described above, the second clock signal I1 for the I signal and the third clock signal Q1 for the Q signal are supplied from the outside of the semiconductor chip to the first mixer 702 and the second mixer 703, respectively, to allow the low frequency components of the outputs from the first mixer 702 and the second mixer 703 to be observed from the outside of the semiconductor chip. With the jitter monitor of the fifth embodiment, it is possible to observe the components synchronized with and in phase with the second clock signal I1 and the third clock signal Q1 that are externally supplied in the jitter. Since, instead of an instantaneous value of the jitter, the jitter amplitude at a certain frequency component or the frequency characteristics of the jitter amplitude are generally often asked in the jitter measurement, the above configuration has the advantage.

Sixth Embodiment

Figure 8:
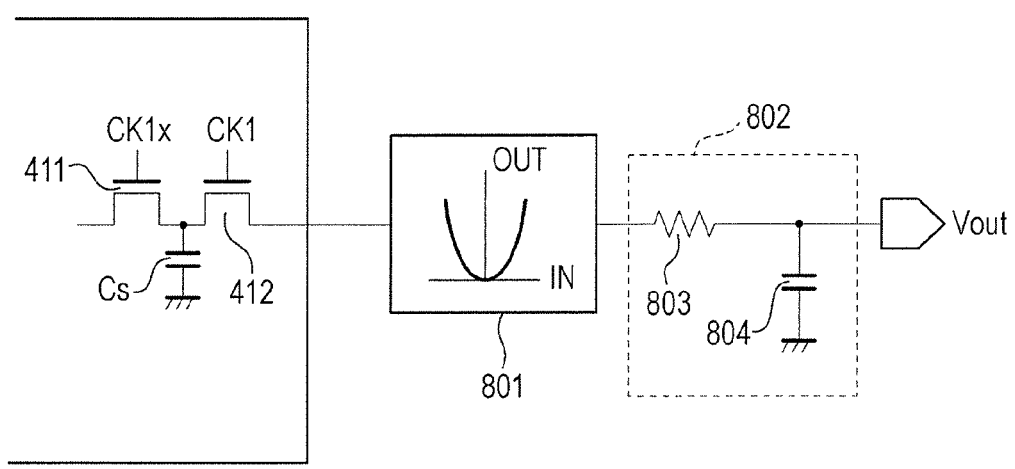
FIG. 8 illustrates an exemplary configuration of a jitter monitor according to a sixth embodiment.

FIG. 8 illustrates an exemplary configuration of a jitter monitor according to a sixth embodiment. Referring to FIG. 8, the transistors 411 and 412 and the capacitor Cs correspond to the sampling circuit 104 in FIG. 1A and correspond to the transistors 411 and 412 and the capacitor Cs in FIG. 4 to FIG. 6. The sixth embodiment differs from the second to fourth embodiments in the following points.

A rectifier circuit 801 rectifies the output from the sampling circuit 104 to output the result of the rectification. A low pass filter 802 includes a resistor 803 and a capacitor 804. The low pass filter 802 performs the low pass filtering to the output from the rectifier circuit 801 to supply an output signal of a low frequency component to the output terminal Vout.

The rectifier circuit 801 may approximately output a square signal of the input signal. With the jitter monitor of the sixth embodiment, it is possible to output a root mean square value of the jitter, instead of the instantaneous value of the jitter, from the output terminal Vout. Since the root mean square value is varied only at low frequencies although a wide band buffer is desirably provided to output the instantaneous value of the jitter, the jitter monitor of the sixth embodiment has the advantage that the root mean square value is capable of being observed with the low-speed small buffer.

Seventh Embodiment

Figure 9:
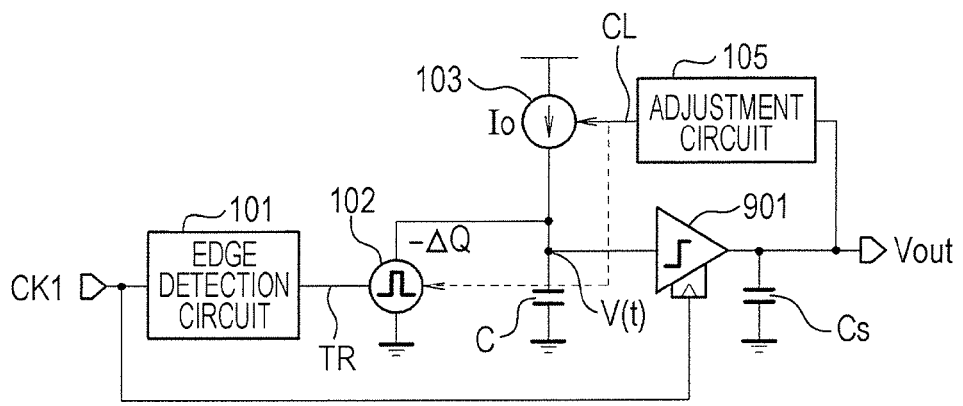
FIG. 9 illustrates an exemplary configuration of a jitter monitor according to a seventh embodiment.

FIG. 9 illustrates an exemplary configuration of a jitter monitor according to a seventh embodiment. The seventh embodiment (FIG. 9) differs from the first embodiment (FIG. 1A) in that a clock driven comparator 901 is used as the sampling circuit 104. The seventh embodiment differs from the first embodiment in the following points.

The clock driven comparator 901 corresponds to the sampling circuit 104 in FIG. 1A. The clock driven comparator 901 compares the voltage at the node V(t) with the reference voltage in synchronization with the rising edge of the first clock signal CK1 to output a digital signal. Instead of the clock driven comparator 901, an analog-to-digital converter may be provided, which converts the analog value of the voltage at the node V(t) to a digital value in synchronization with the rising edge of the first clock signal CK1.

The clock driven comparator 901 operating in response to the clock signal is used as the sampling circuit 104 in the seventh embodiment. The use of the clock driven comparator 901 quantizes the jitter amplitude to cause analog information to be lost. However, causing the quantized jitter signal to pass through a filter to observe the low frequency component allows the frequency characteristics of the jitter to be acquired. The seventh embodiment has the advantage that the circuit configuration is made simpler and the jitter information is capable of being processed with a normal logic circuit. Use of multiple comparators 901 to compose a low-bit analog-to-digital converter allows the analog information about the jitter to be acquired to some extent to advantageously realize the signal processing of the analog information with the logic circuit.

Eighth Embodiment

Figure 10:
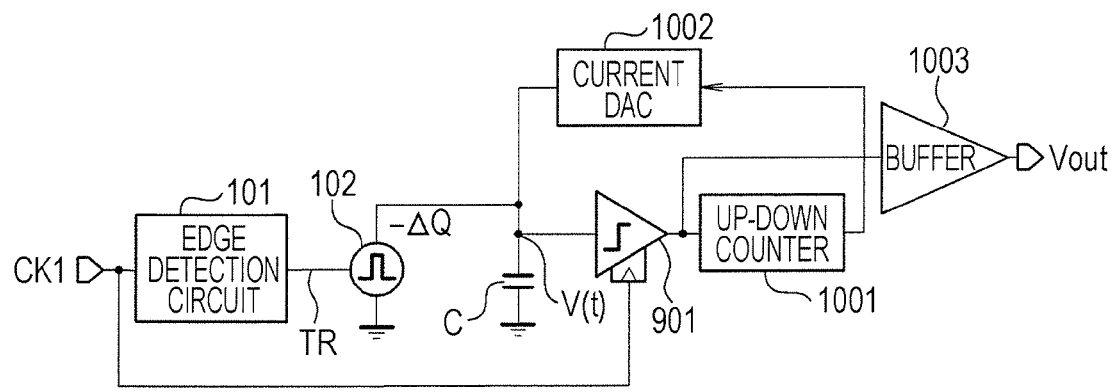
FIG. 10 illustrates an exemplary configuration of a jitter monitor according to an eighth embodiment.

FIG. 10 illustrates an exemplary configuration of a jitter monitor according to an eighth embodiment. The jitter monitor of the eighth embodiment (FIG. 10) results from deletion of the capacitor Cs, the adjustment circuit 105, and the first current source 103 from the jitter monitor of the seventh embodiment (FIG. 9) and addition of an up-down counter 1001, a current digital-to-analog converter 1002, and a buffer 1003 to the jitter monitor of the seventh embodiment (FIG. 9). The eighth embodiment differs from the seventh embodiment in the following points.

The clock driven comparator 901 corresponds to the sampling circuit 104 in FIG. 1A and performs an operation similar to the one described above with reference to FIG. 9. The up-down counter 1001 corresponds to the adjustment circuit 105 in FIG. 1A and performs up-down counting on the basis of the digital signal output from the clock driven comparator 901. For example, the up-down counter 1001 increases the count value by one ("1") if the digital signal has a value of one ("1") and decreases the count value by one ("1") if the digital signal has a value of zero ("0"). The current digital-to-analog converter 1002 corresponds to the first current source 103 in FIG. 1A. The current digital-to-analog converter 1002 converts the digital value counted by the up-down counter 1001 to an analog value to supply the analog constant current Io to the node V(t). The current digital-to-analog converter 1002 and the capacitor C composes a voltage generating circuit that supplies the voltage varied with time at a certain inclination to the node V(t).

In the eighth embodiment, the clock driven comparator 901 compares the voltage at the node V(t) with the reference voltage. The up-down counter (digital circuit) 1001 performs the up-down counting of the digital value resulting from the comparison to output a digital code of the count value. The current digital-to-analog converter 1002 converts the digital code into the analog current Io. Since all the feedback circuits are composed of digital circuits in the eighth embodiment, the eighth embodiment has the advantage that the stable operation without the variation in temperature and process is enabled.

As described above, according to the first to eighth embodiments, it is possible to measure the amount of jitter of the first clock signal CK1 with the relatively simple circuit in which the capacitors, the current source, and the compact logical gates are combined with each other without the external supply of the low-jitter reference clock signal. Accordingly, the jitter monitors are capable of actually measuring the amount of jitter in various portions in the circuit.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A jitter monitor comprising:
    a voltage generating circuit configured to generate a first voltage that is varied with time at a predetermined inclination;
    a voltage reducing circuit configured to reduce the first voltage by a predetermined voltage in synchronization with a first clock signal so as to generate a second voltage that is varied with time at the predetermined inclination in synchronization with the first clock signal; and
    a sampling circuit configured to sample a portion having the predetermined inclination of the second voltage.

2. The jitter monitor according to claim 1, further comprising:
    an adjustment circuit configured to adjust the inclination of the first voltage or the predetermined voltage so that a time average value of the second voltage agrees with a reference value.

3. The jitter monitor according to claim 2,
    wherein the adjustment circuit adjusts the inclination of the first voltage or the predetermined voltage, based on an integral value of a difference between the second voltage sampled by the sampling circuit and the reference value.

4. The jitter monitor according to claim 1,
    wherein the voltage generating circuit includes a first current source and a capacitor.

5. The jitter monitor according to claim 2,
    wherein the voltage generating circuit includes a first current source and a capacitor.

6. The jitter monitor according to claim 3,
    wherein the voltage generating circuit includes a first current source and a capacitor.

7. The jitter monitor according to claim 4,
    wherein the voltage reducing circuit includes
        an edge detection circuit configured to detect an edge of the first clock signal;
        a first transistor configured to connect a terminal of the capacitor to a ground voltage node upon detection of the edge by the edge detection circuit; and
        a second current source configured to be connected between the first transistor and the ground voltage node.

8. The jitter monitor according to claim 5,
    wherein the voltage reducing circuit includes
        an edge detection circuit configured to detect an edge of the first clock signal;
        a first transistor configured to connect a terminal of the capacitor to a ground voltage node upon detection of the edge by the edge detection circuit; and
        a second current source configured to be connected between the first transistor and the ground voltage node.

9. The jitter monitor according to claim 6,
    wherein the voltage reducing circuit includes
        an edge detection circuit configured to detect an edge of the first clock signal;
        a first transistor configured to connect a terminal of the capacitor to a ground voltage node upon detection of the edge by the edge detection circuit; and
        a second current source configured to be connected between the first transistor and the ground voltage node.

10. The jitter monitor according to claim 1, further comprising:
    a first mixer configured to mix a second clock signal with the second voltage sampled by the sampling circuit; and a second mixer configured to mix a third clock signal orthogonal to the second clock signal with the second voltage sampled by the sampling circuit.

11. The jitter monitor according to claim 1, further comprising:
   a rectifier circuit configured to rectify the second voltage sampled by the sampling circuit; and
   a low pass filter configured to perform low pass filtering to the second voltage rectified by the rectifier circuit.

12. The jitter monitor according to claim 1,
   wherein the sampling circuit includes a comparator configured to compare the first voltage generated by the voltage generating circuit with a reference voltage in synchronization with the first clock signal to generate a digital signal.

13. The jitter monitor according to claim 2,
   wherein the sampling circuit includes a comparator configured to compare the first voltage generated by the voltage generating circuit with a reference voltage in synchronization with the first clock signal to generate a digital signal,
   wherein the adjustment circuit includes an up-down counter configured to count the digital signal generated by the comparator, and
   wherein the voltage generating circuit includes a digital-to-analog converter configured to convert the digital value counted by the up-down counter to an analog value.

* * * * *